US008173515B2

(12) United States Patent
Nakamori et al.

(10) Patent No.: US 8,173,515 B2
(45) Date of Patent: May 8, 2012

(54) METHOD FOR MANUFACTURING SEMICONDUCTOR DEVICE

(75) Inventors: Toshiya Nakamori, Tokyo (JP); Hiroshi Kujirai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 189 days.

(21) Appl. No.: 12/497,315

(22) Filed: Jul. 2, 2009

(65) Prior Publication Data

US 2010/0022069 A1 Jan. 28, 2010

(30) Foreign Application Priority Data

Jul. 22, 2008 (JP) ................................. 2008-188489

(51) Int. Cl.
*H01L 21/762* (2006.01)
(52) U.S. Cl. ................................ 438/435; 257/E21.546
(58) Field of Classification Search .................. 438/405, 438/424, 425, 426, 435, 439, 443
See application file for complete search history.

(56) References Cited

U.S. PATENT DOCUMENTS

| 5,436,488 | A  | * | 7/1995  | Poon et al. ..................... 257/397 |
| 5,447,884 | A  | * | 9/1995  | Fahey et al. ................... 438/437 |
| 5,989,978 | A  | * | 11/1999 | Peidous ......................... 438/436 |
| 6,100,163 | A  | * | 8/2000  | Jang et al. ..................... 438/437 |
| 6,255,194 | B1 | * | 7/2001  | Hong ............................. 438/435 |
| 6,329,266 | B1 | * | 12/2001 | Hwang et al. ................. 438/424 |
| 6,436,762 | B1 | * | 8/2002  | Tzeng et al. ................... 438/253 |
| 6,482,718 | B2 | * | 11/2002 | Shiozawa et al. ............. 438/446 |
| 6,500,726 | B2 | * | 12/2002 | Lee et al. ....................... 438/424 |
| 6,699,773 | B2 | * | 3/2004  | Lee et al. ....................... 438/424 |
| 6,709,924 | B1 | * | 3/2004  | Yu et al. ......................... 438/257 |
| 6,825,128 | B2 | * | 11/2004 | Masuda .......................... 438/750 |
| 6,869,860 | B2 | * | 3/2005  | Belyansky et al. ............ 438/435 |
| 7,071,076 | B2 | * | 7/2006  | Liu ................................. 438/439 |
| 7,125,769 | B2 | * | 10/2006 | Dong .............................. 438/257 |
| 7,259,074 | B2 | * | 8/2007  | Jung et al. ...................... 438/296 |
| 7,358,588 | B2 | * | 4/2008  | Youn et al. ..................... 257/510 |
| 7,427,553 | B2 | * | 9/2008  | Kim .............................. 438/427 |
| 7,557,415 | B2 | * | 7/2009  | Youn et al. ..................... 257/374 |
| 7,563,689 | B2 | * | 7/2009  | Hong ............................. 438/426 |
| 7,659,159 | B2 | * | 2/2010  | Lee ................................ 438/210 |
| 7,763,523 | B2 | * | 7/2010  | Ahn et al. ...................... 438/425 |

(Continued)

FOREIGN PATENT DOCUMENTS

JP 2004-311487 11/2004

(Continued)

OTHER PUBLICATIONS

Heo, Jin-Hwa et al. (2003). "The P-SOG Filling Shallow Trench Isolation Technology for sub-70nm Device," 2003 Symposium on VLSI Technology Digest of Technical Papers.

*Primary Examiner* — David Vu
*Assistant Examiner* — Earl Taylor
(74) *Attorney, Agent, or Firm* — Morrison & Foerster LLP

(57) ABSTRACT

An oxide film and a liner film are formed on an inner wall of a trench in a semiconductor substrate. After filling an SOD film in the trench, a heat treatment is carried out. Part of the liner film in contact with the SOD film is removed to expose part of the SOD film. A heat treatment is carried out on the SOD film. An isolating region is formed by filling an insulating film in the trench.

19 Claims, 24 Drawing Sheets

U.S. PATENT DOCUMENTS

| | | | | |
|---|---|---|---|---|
| 7,858,489 | B2* | 12/2010 | Kim | 438/425 |
| 2002/0167067 | A1* | 11/2002 | Kim | 257/506 |
| 2004/0029353 | A1* | 2/2004 | Zheng et al. | 438/424 |
| 2004/0126991 | A1* | 7/2004 | Kim | 438/435 |
| 2004/0198019 | A1* | 10/2004 | Yasui et al. | 438/435 |
| 2004/0248374 | A1* | 12/2004 | Belyansky et al. | 438/428 |
| 2006/0125043 | A1* | 6/2006 | Smythe et al. | 257/506 |
| 2006/0183296 | A1* | 8/2006 | Yoo et al. | 438/424 |
| 2007/0087521 | A1* | 4/2007 | Fujita | 438/424 |
| 2007/0164391 | A1* | 7/2007 | Youn et al. | 257/510 |
| 2007/0166951 | A1* | 7/2007 | Arisumi et al. | 438/425 |
| 2008/0003773 | A1* | 1/2008 | Kwak et al. | 438/425 |
| 2008/0087981 | A1* | 4/2008 | Matsuno | 257/510 |
| 2008/0090378 | A1* | 4/2008 | Tsunoda et al. | 438/425 |
| 2008/0121977 | A1* | 5/2008 | Choi et al. | 257/321 |
| 2008/0160716 | A1* | 7/2008 | Seo et al. | 438/425 |
| 2008/0160718 | A1* | 7/2008 | Lee et al. | 438/425 |
| 2008/0194075 | A1* | 8/2008 | Wu | 438/425 |
| 2008/0213970 | A1* | 9/2008 | Piccolo et al. | 438/425 |
| 2008/0227268 | A1* | 9/2008 | Lee | 438/425 |
| 2008/0254593 | A1* | 10/2008 | Eun et al. | 438/425 |
| 2008/0290446 | A1* | 11/2008 | Shin et al. | 257/510 |
| 2008/0305611 | A1* | 12/2008 | Hirota | 438/425 |
| 2009/0004816 | A1* | 1/2009 | Lee et al. | 438/425 |
| 2009/0035917 | A1* | 2/2009 | Ahn et al. | 438/425 |
| 2009/0068816 | A1* | 3/2009 | Eun | 438/425 |
| 2009/0068817 | A1* | 3/2009 | Eun | 438/425 |
| 2009/0111238 | A1* | 4/2009 | Kim | 438/425 |
| 2009/0140374 | A1* | 6/2009 | Choi | 257/506 |
| 2009/0170280 | A1* | 7/2009 | Park | 438/425 |
| 2009/0184402 | A1* | 7/2009 | Chen | 257/647 |
| 2010/0001378 | A1* | 1/2010 | DeNatale et al. | 257/621 |
| 2010/0022069 | A1* | 1/2010 | Nakamori et al. | 438/424 |

FOREIGN PATENT DOCUMENTS

| | | |
|---|---|---|
| JP | 2006-156471 | 6/2006 |
| JP | 2006-269789 | 10/2006 |
| JP | 2007-227901 | 9/2007 |
| JP | 2008-010724 | 1/2008 |
| JP | 2008-034624 | 2/2008 |

* cited by examiner

METHOD FOR MANUFACTURING SEMICONDUCTOR DEVICE

BACKGROUND OF THE INVENTION

1. Field of the Invention

The present invention relates to a method for manufacturing a semiconductor device with an isolating region.

2. Description of the Related Art

An isolating region has been used to isolate a plurality of elements that form a semiconductor device. A known example of an isolating region has an STI (Shallow Trench Isolation) structure in which a trench is provided and an insulating material is filled in the trench.

A study has been conducted on a method for filling an insulating material in a trench in an isolating region having an STI structure.

Japanese Patent Laid-Open No. 2008-10724 discloses a method for filling an oxide film (hereinafter referred to as an "HDP oxide film") in a trench by using the HDP method (High Density Plasma Method).

Japanese Patent Laid-Open No. 2006-269789 discloses an isolating region including a hybrid structure formed of an HDP oxide film and an SOD (Spin on Dielectric) film.

In a miniaturized LSI process, a highly fillable SOD monolayer film is required. "The P-SOG Filling Shallow Trench Isolation Technology for sub-70 nm Device," J. H. Heo et al., 2003 Symposium on VLSI Technology discloses a method for forming a highly fillable SOD monolayer film.

SUMMARY OF THE INVENTION

In one embodiment, there is provided a method for manufacturing a semiconductor device, the method comprising:

forming a mask pattern on a semiconductor substrate;
etching the semiconductor substrate by using the mask pattern as a mask, to form a trench;
forming an oxide film on an inner wall of the trench;
forming a liner film so as to cover the oxide film on the inner wall of the trench;
filling an SOD oxide film in the trench;
removing the mask pattern and part of the liner film in contact with the SOD oxide film to expose part of the SOD oxide film and form a gap in the trench;
carrying out a heat treatment on the SOD oxide film; and
filling an insulating film in the gap in the trench to form an isolating region.

In another embodiment, there is provided a method for manufacturing a semiconductor device, the method comprising:

forming a mask film on a semiconductor substrate;
patterning the mask film to form a mask pattern;
etching the semiconductor substrate by using the mask pattern as a mask, to form a trench;
thermally oxidizing an inner wall of the trench, to form an oxide film;
forming a liner film so as to cover the oxide film on the inner wall of the trench;
depositing an SOD film over the trench and then carrying out a heat treatment to convert the SOD film into an SOD oxide film;
processing the SOD oxide film to a predetermined height in the trench by
(a) using the mask pattern as a stopper to carry out chemical mechanical polishing on the SOD oxide film and then etching back the SOD oxide film, or
(b) etching back the SOD oxide film;
removing the mask pattern and part of the liner film in contact with the SOD oxide film, to expose part of the SOD oxide film and form a gap in the trench;
carrying out a heat treatment on the SOD oxide film; and
filling an insulating film in the gap in the trench, to form an isolating region.

In another embodiment, there is provided a method for manufacturing a semiconductor device, the method comprising:

forming a trench in a semiconductor substrate;
forming an oxide film on an inner wall of the trench;
forming a liner film so as to cover the oxide film on the inner wall of the trench;
filling an SOD oxide film in the trench;
removing part of the liner film in contact with the SOD oxide film to expose part of the SOD oxide film and form a gap in the trench;
carrying out a heat treatment on the SOD oxide film; and
filling an insulating film in the gap in the trench, to form an isolating region.

BRIEF DESCRIPTION OF THE DRAWINGS

The above features and advantages of the present invention will be more apparent from the following description of certain preferred embodiments taken in conjunction with the accompanying drawings, in which.

Figure 1:
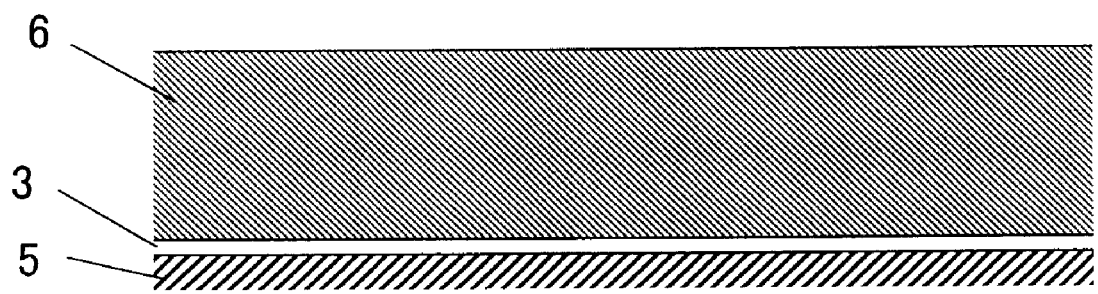
FIG. 1 shows a process of a method for manufacturing a semiconductor device according to a first embodiment.

In the drawings, numerals have the following meanings. 1: SOD oxide film, 2: SiN film, 3: $SiO_2$ film, 4, 4a, 4b: SiN film, 5: silicon semiconductor substrate, 6: SiN film, 7: trench, 200: semiconductor substrate, 201: transistor, 203: isolating region, 204: active region, 205: impurity diffusion layer for source/drain regions, 206: gate trench, 207, 211: first contact plug, 208, 209, 214, 215: second contact plug, 210, 213, 216, 218: interlayer insulating film, 212: wiring layer, 217: capacitor element, 219: wiring layer, 220: surface protective film.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Exemplary Embodiment

First, silicon thermal oxide film 3 is formed as a pad oxide film on silicon substrate 5, and then silicon nitride film 6, which serves as a hard mask when a field is formed, is formed on silicon oxide film 3, as shown in FIG. 1. The thickness of silicon oxide film 3, for example, ranges from 5 nm to 15 nm, but is preferably 9 nm. The thickness of silicon nitride film 6, for example, ranges from 50 nm to 200 nm, but is preferably 120 nm.

Figure 2:
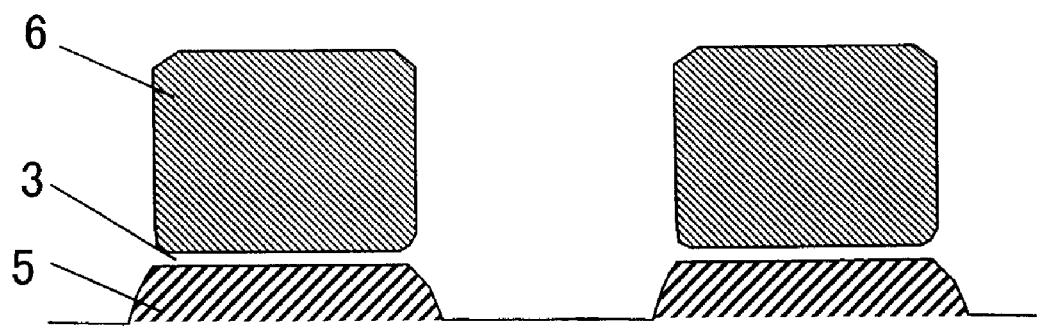
FIG. 2 shows a process of the method for manufacturing a semiconductor device according to the first embodiment.

Thereafter, a typical lithography process is used to process silicon nitride film 6 and pad oxide film 3 to form a hard mask used in silicon etching, as shown in FIG. 2. In this process, silicon substrate 5 is also slightly etched due to overetching.

Figure 3:
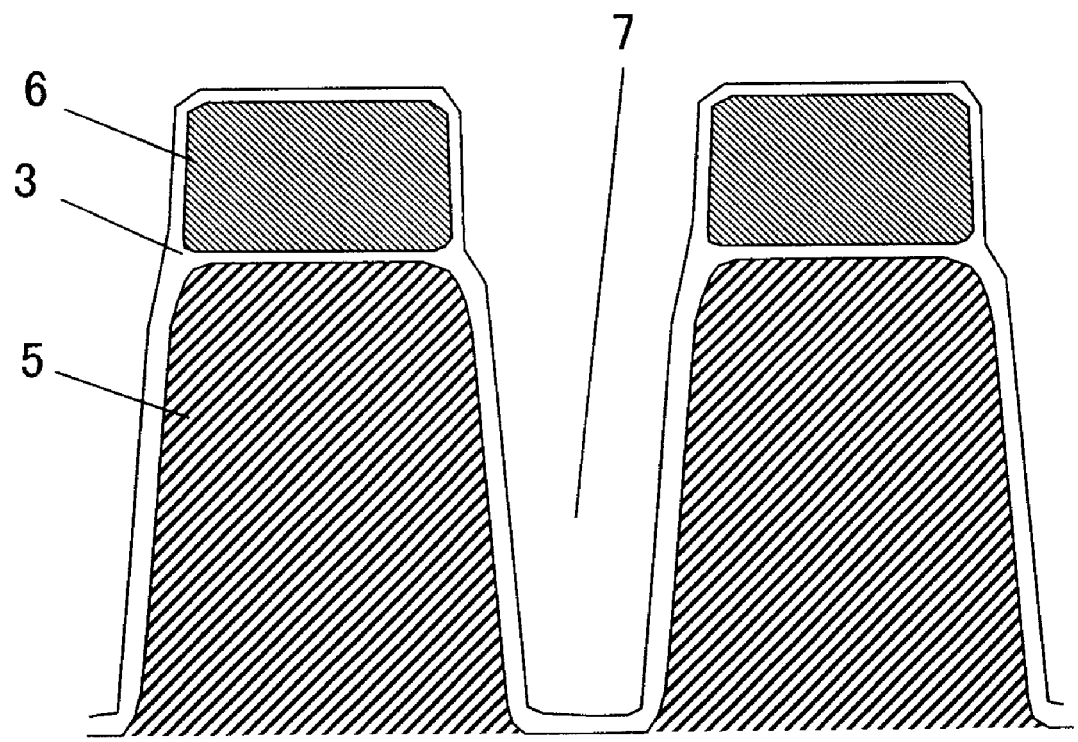
FIG. 3 shows a process of the method for manufacturing a semiconductor device according to the first embodiment.

Thereafter, silicon nitride film 6 is used as a hard mask to form STI trench 7 having a depth of approximately 200 nm in silicon substrate 5, as shown in FIG. 3. In this process, part of the upper portion of silicon nitride film 6, approximately 40 nm, is etched away. Silicon thermal oxide film 3 is then formed on the sides and the bottom of STI trench 7 by thermal oxidation. The thickness of silicon oxide film 3, for example, ranges from 3 to 15 nm, but is preferably 8 nm. In this process, part of silicon nitride film 6, which is the hard mask, is also oxidized. The oxidized portion is approximately 3 nm.

Figure 4:
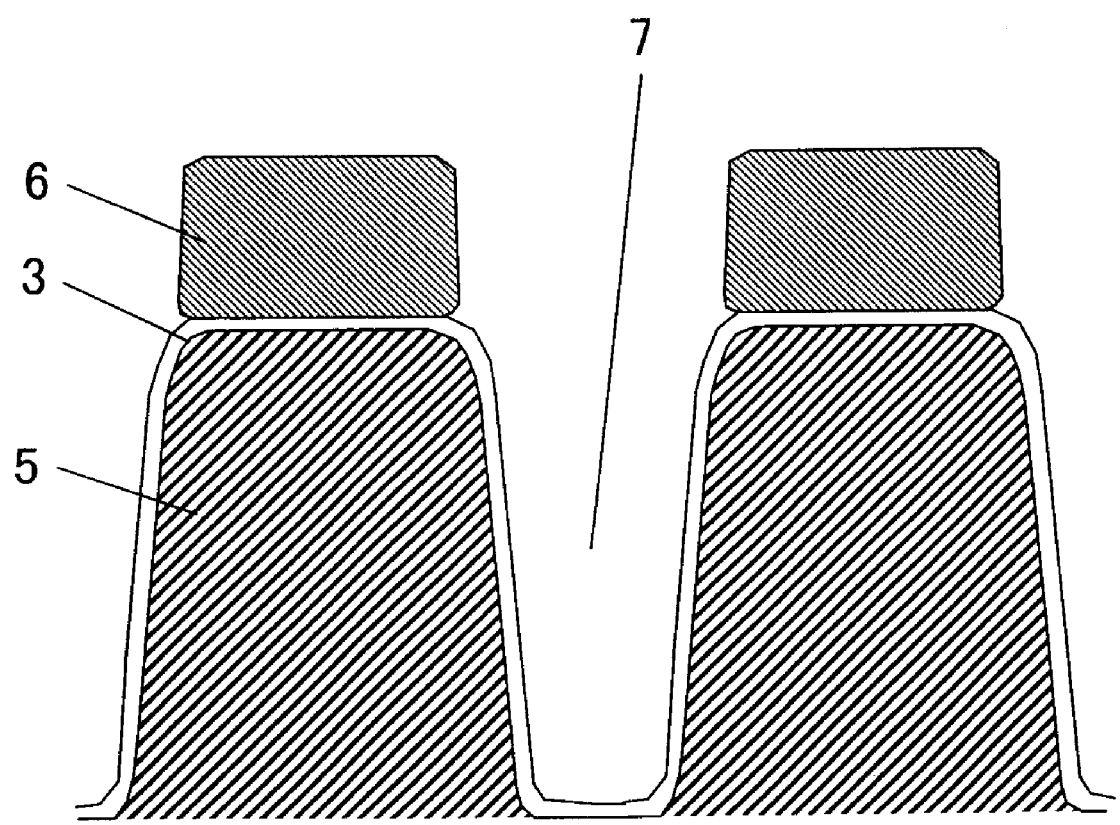
FIG. 4 shows a process of the method for manufacturing a semiconductor device according to the first embodiment.

Thereafter, silicon oxide film 3 on silicon nitride film 6, which is the hard mask, is removed by wet etching, as shown in FIG. 4. The reason for this is to prevent silicon oxide film 3 from being left on the sides when silicon nitride film 6, which is the hard mask, is removed by wet etching using hot phosphoric acid, otherwise remaining silicon oxide film 3 causes contamination. In this process, silicon oxide film 3 on the sides and bottom of STI trench 7 is also slightly etched but remains because the original film thickness is sufficiently thick.

Figure 5:
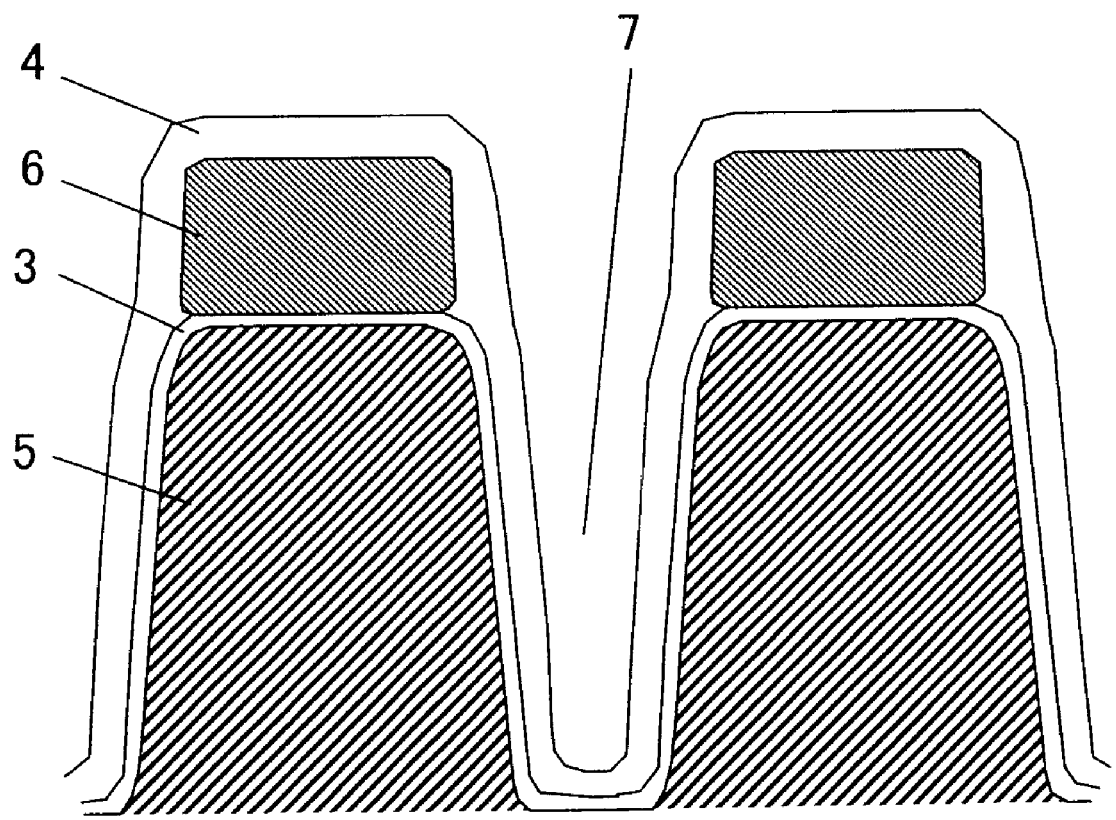
FIG. 5 shows a process of the method for manufacturing a semiconductor device according to the first embodiment.

Thereafter, liner nitride film 4 is formed to cover STI trench 7 and silicon nitride film 6, as shown in FIG. 5. Liner nitride film 4 is formed so as to have an adequate thickness because it will be etched with hot phosphoric acid when silicon nitride film 6, which is the hard mask, is removed in subsequent process. The thickness of liner nitride film 4, for example, ranges from 3 to 15 nm, but is preferably 8 nm.

Figure 6:
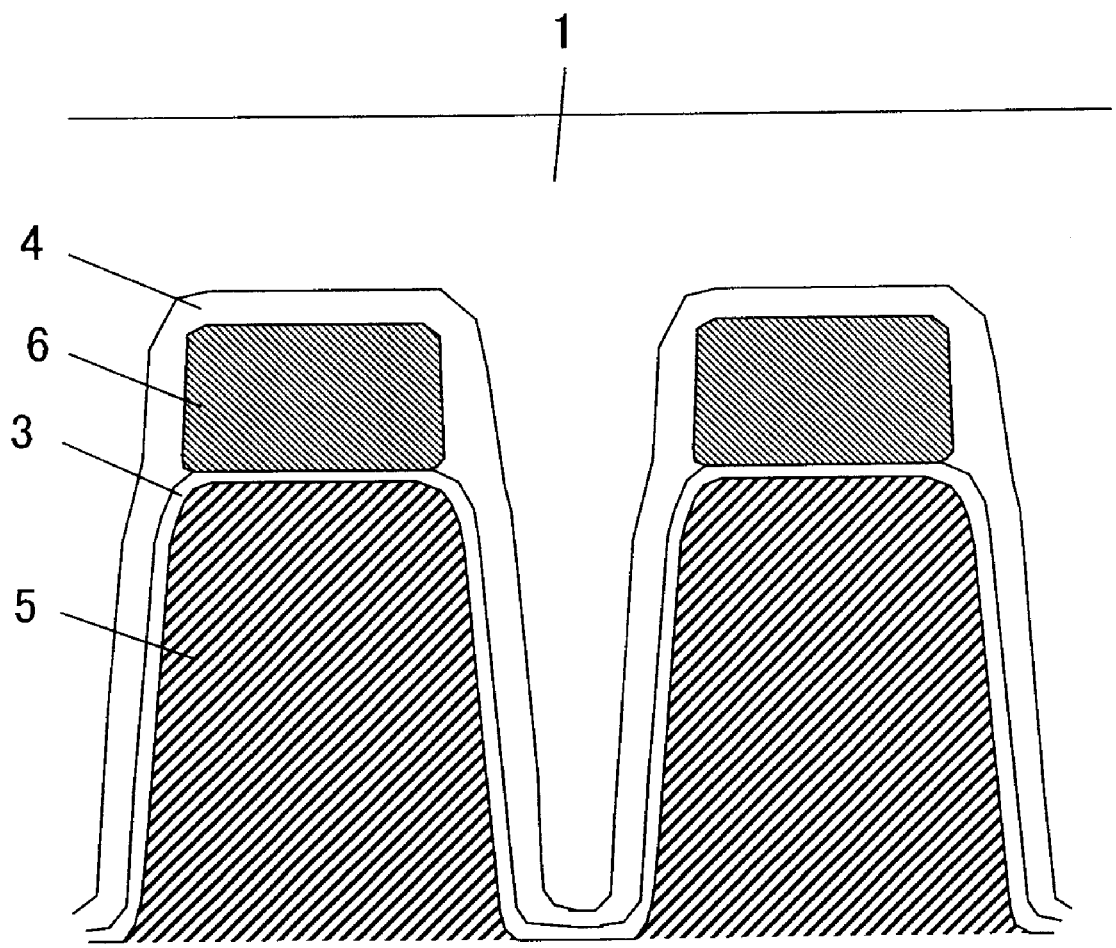
FIG. 6 shows a process of the method for manufacturing a semiconductor device according to the first embodiment.

Thereafter, spin coating or spray coating is used to form a polysilazane film, as shown in FIG. 6. The polysilazane film corresponds to an SOD film (spin on dielectric oxide film). Silicon substrate 5 on which the polysilazane film has been formed is then baked on a hot plate heated to 150° C. for approximately 3 minutes to volatilize any solvent in the solution. Subsequently, resultant silicon substrate 5 is heat-treated in a water vapor atmosphere at a temperature ranging from 400° C. to 1100° C. The heat treatment causes most of the Si—Ni bonds in the polysilazane film to be substituted with Si—O bonds, leaving a SOD oxide film 1 (spin on dielectric oxide film). The SOD oxide film 1 corresponds to a silicon oxide film. However, since the reaction starts from the surface, the densification of SOD oxide film 1 in STI trench 7 is insufficient.

Figure 7:
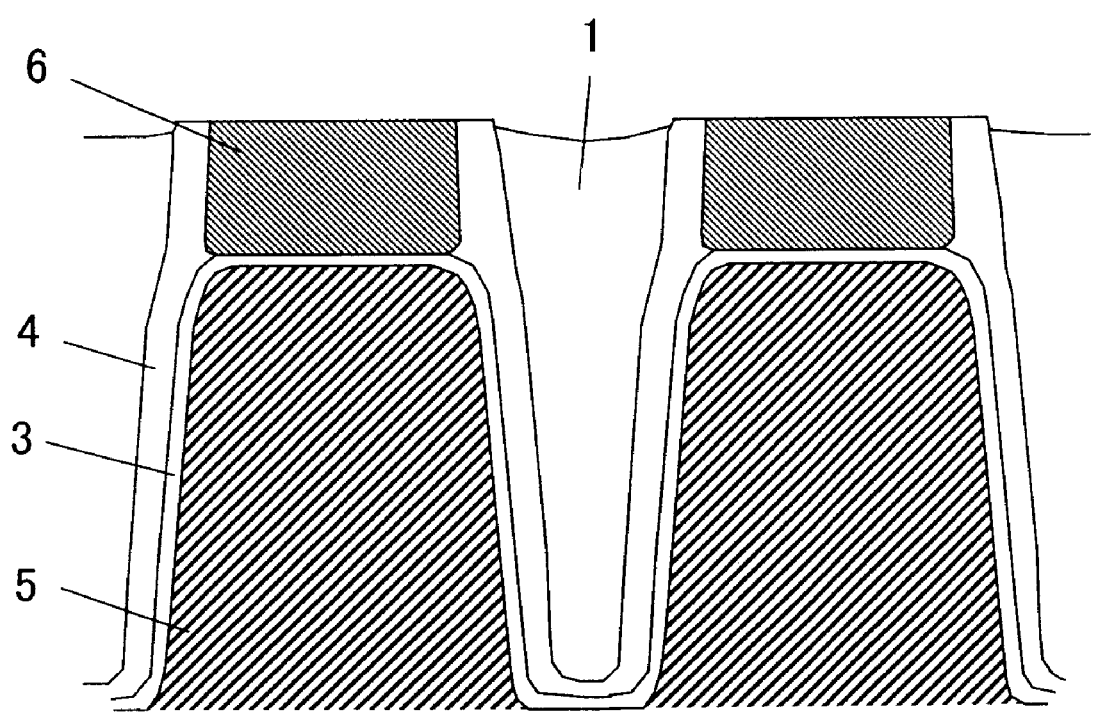
FIG. 7 shows a process of the method for manufacturing a semiconductor device according to the first embodiment.

Thereafter, silicon nitride film 6, which is the hard mask, is used as a stopper, and SOD oxide film 1 is polished in a CMP (Chemical Mechanical Polishing) process so that SOD oxide film 1 is left in STI trench 7, as shown in FIG. 7.

Figure 8:
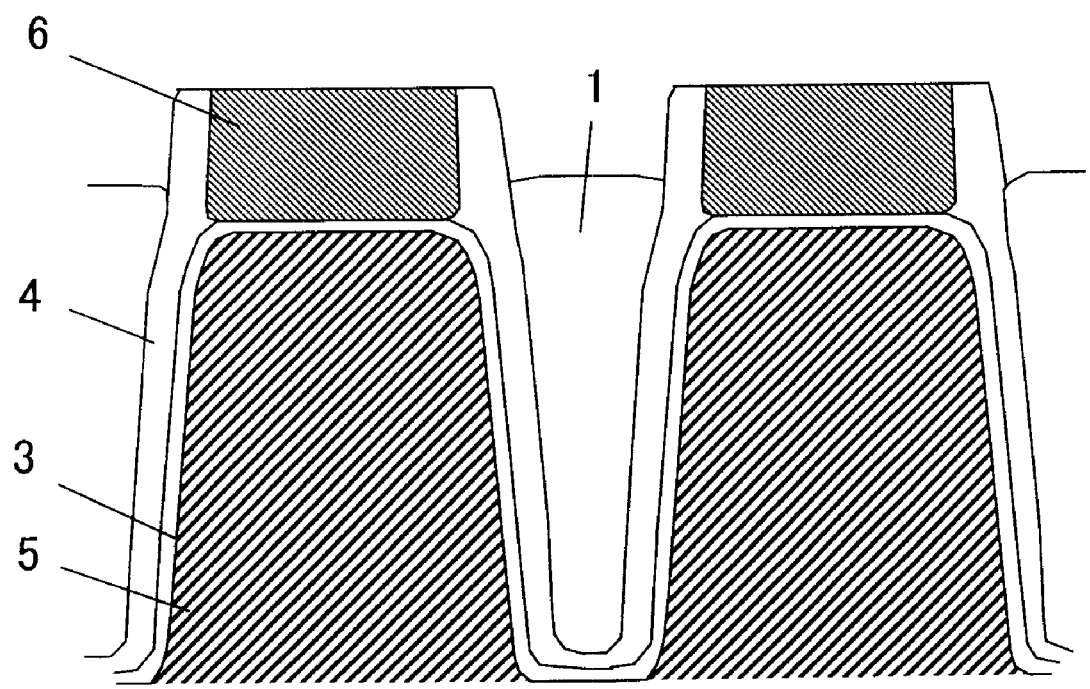
FIG. 8 shows a process of the method for manufacturing a semiconductor device according to the first embodiment.

Subsequently, wet etching or dry etching is used to etch back silicon oxide film (SOD film) 1 to a desired height in STI trench 7, as shown in FIG. 8. In other embodiments, only wet etching or dry etching may be used, instead of CMP, to etch back SOD oxide film 1. After the CMP or the etching back, a heat treatment may be further carried out to densify SOD oxide film 1.

Figure 9:
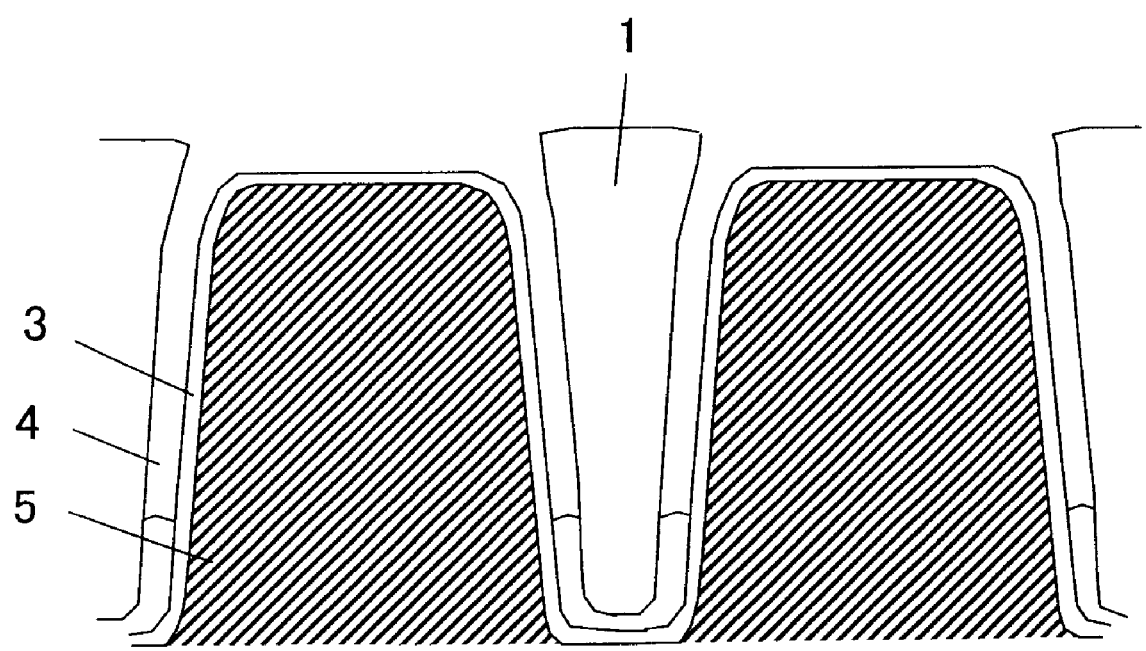
FIG. 9 shows a process of the method for manufacturing a semiconductor device according to the first embodiment.

Thereafter, wet etching using hot phosphoric acid is carried out to remove silicon nitride film 6, which is the hard mask, as shown in FIG. 9. In this process, since the liner nitride film 4 is sufficiently thick, the hot phosphoric acid gets into and etches the liner nitride film 4. For example, when the temperature of the hot phosphoric acid is 140° C. and the wet etching period is 90 minutes, the amount of liner nitride film 4 to be etched is approximately 150 nm from the upper end of STI trench 7. While silicon nitride film 6, which is the hard mask, and liner nitride film 4 are simultaneously removed with the hot phosphoric acid in the present exemplary embodiment, liner film 4 may be separately removed to adjust the amount of recess. The amount of recess of liner film 4 that can be handled in the present embodiment is a depth that can be backfilled with ALD-SiN, which means that liner film 4 can be removed to a depth that corresponds to an aspect ratio of approximately 10.

Thereafter, the resultant structure is heat-treated in a nitrogen atmosphere at a temperature ranging from 700° C. to 1100° C. for 60 minutes. In this process, since liner nitride film 4 is recessed, SOD oxide film 1 facing the STI sidewalls is exposed and the surface area of SOD oxide film 1 increases accordingly, which facilitates the densification of SOD oxide film 1 in the heat treatment. As a result, the etching rate achieved by the wet etchant, for example, BHF (Buffered HF), can be reduced by approximately 50% compared to those used in related art.

Figure 10:
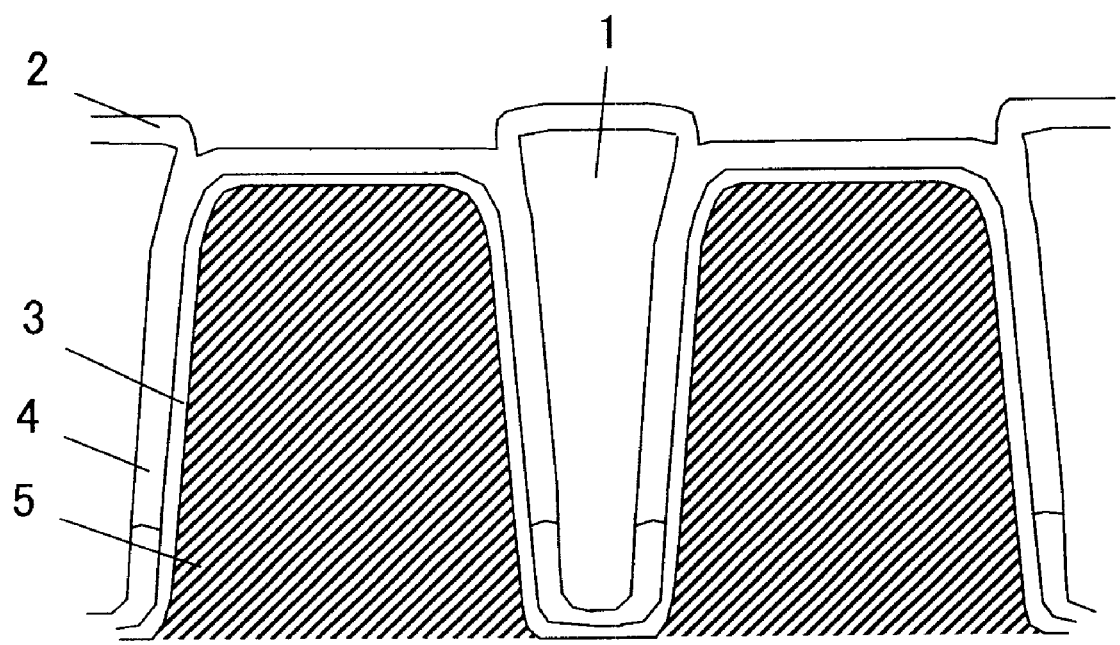
FIG. 10 shows a process of the method for manufacturing a semiconductor device according to the first embodiment.
Figure 11:
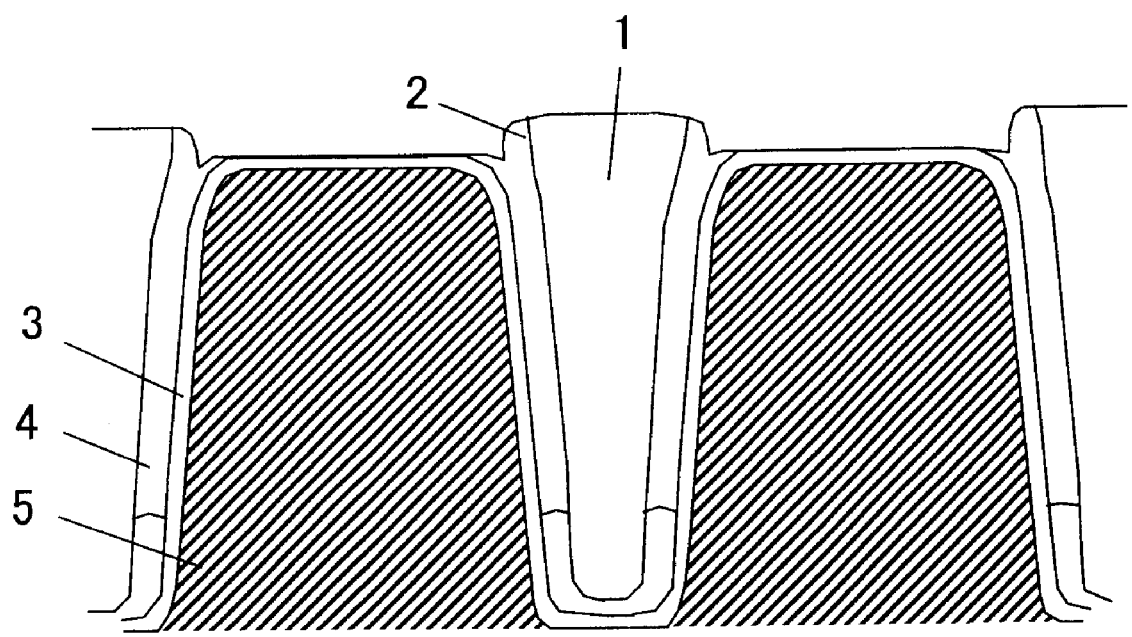
FIG. 11 shows a process of the method for manufacturing a semiconductor device according to the first embodiment.

Thereafter, an ALD method (Atomic Layer Deposition Method) is used to deposit SiN film 2 so as to fill the recess of liner nitride film 4, and then SiN film 2 is etched back, as shown in FIGS. 10 and 11. The recessed portion is thus backfilled and the step becomes lower accordingly, whereby an inter-gate short circuit, which is a defect, can be eliminated.

In the present exemplary embodiment, the heat treatment is carried out with liner film 4 recessed from the upper side of STI trench 7. Since liner film 4 is thus removed, the sides of part of SOD oxide film 1 are exposed and the surface area thereof increases accordingly, which facilitates the densification of SOD oxide film 1 in the heat treatment. After the heat treatment, a high-coverage insulating film, such as ALD-SiN (ALD: Atomic Layer Deposition), can be deposited and etched back to fill the recess. It is therefore possible to eliminate a gate short circuit defect that occurs when a gate electrode material gets into the gap produced in the isolating region and the gate electrode material is not removed but remains in the following processes. Moreover, since SOD oxide film 1 is further densified, a high-quality silicon oxide film that is not affected, for example, by stationary electric charge but has excellent electric characteristics can be provided.

Second Exemplary Embodiment

In the first exemplary embodiment, the final heat treatment on SOD oxide film 1 (spin on dielectric oxide film) is carried out in a nitrogen atmosphere. From the viewpoint of electric characteristics, the heat treatment is preferably carried out in a water vapor atmosphere to address, for example, stationary electric charge in SOD oxide film 1. However, when SOD oxide film 1 with recessed liner film 4 undergoes water vapor oxidization as shown in FIG. 9 in the first exemplary embodiment, silicon substrate 5 is disadvantageously oxidized. In the following second exemplary embodiment, a method for manufacturing a semiconductor device including differently structured liner film 4 to prevent silicon substrate 5 from being oxidized will be described.

Figure 12:
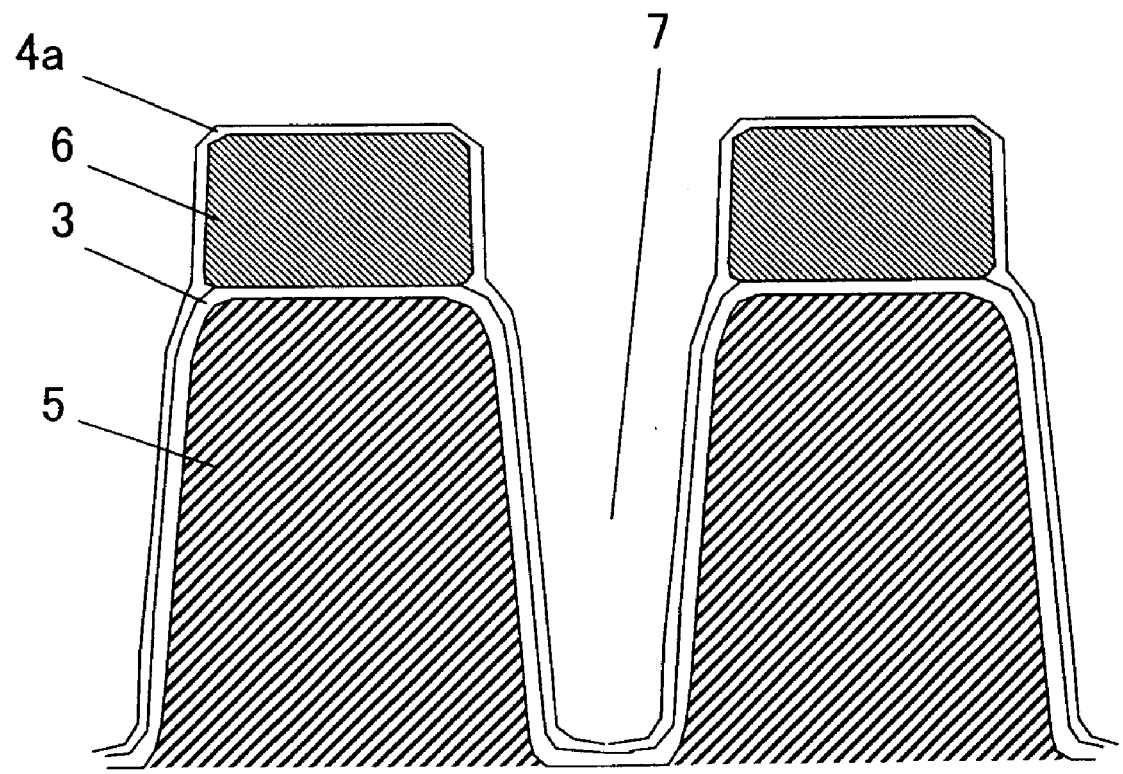
FIG. 12 shows a process of a method for manufacturing a semiconductor device according to a second embodiment.

As shown in FIGS. 2 to 4 in the first exemplary embodiment, the formation of STI trench 7, the inner wall oxidation, and the removal of silicon oxide film 3 on silicon nitride film 6, which is the hard mask, by wet etching are carried out. Thereafter, liner nitride film 4a for preventing oxidation is formed so as to cover STI trench 7 and silicon nitride film 6, as shown in FIG. 12. The thickness of liner nitride film 4a is preferably set to a value that does not allow hot phosphoric acid to get into or etch liner nitride film 4a. The thickness ranges, for example, from 1 nm to 4 nm, but is preferably 3 nm.

Figure 13:
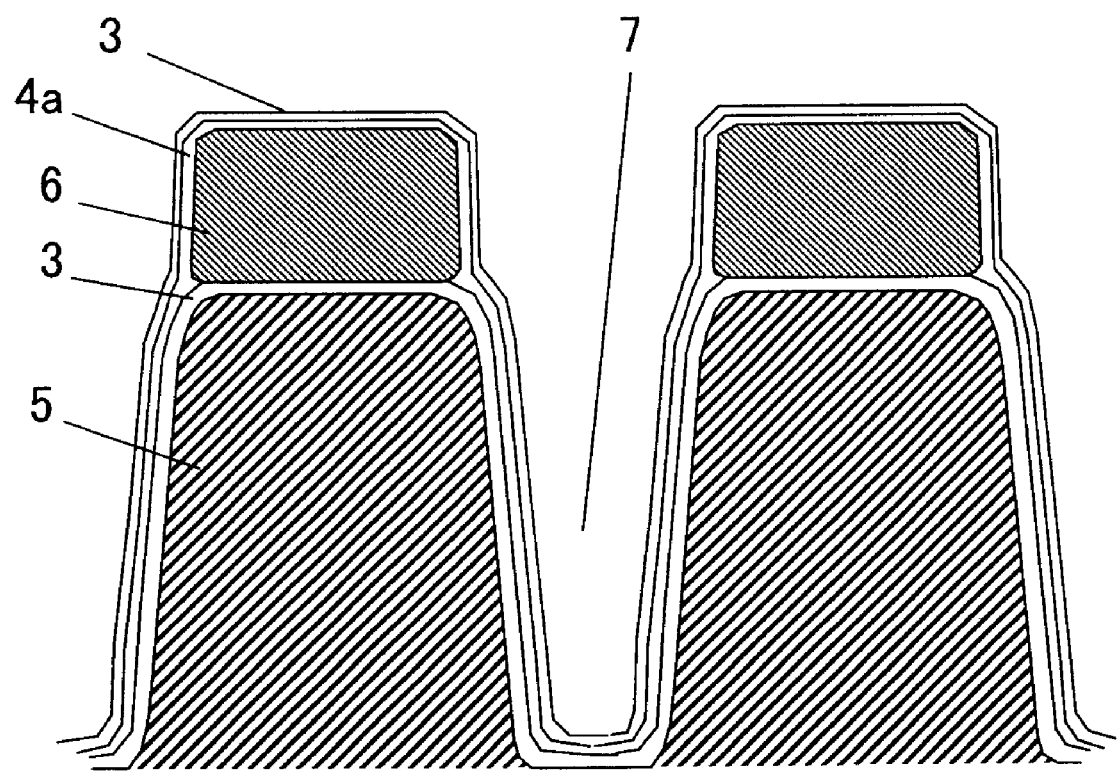
FIG. 13 shows a process of the method for manufacturing a semiconductor device according to the second embodiment.

Thereafter, silicon oxide film 3, as shown in FIG. 13, to protect liner nitride film 4a during the hot phosphoric acid process. The silicon oxide film 3 corresponds to part of the liner film. The silicon oxide film 3 is formed by CVD (Chemical Vapor Deposition). The thickness of silicon oxide film 3, for example, ranges from 3 to 8 nm, but is preferably 5 nm.

Figure 14:
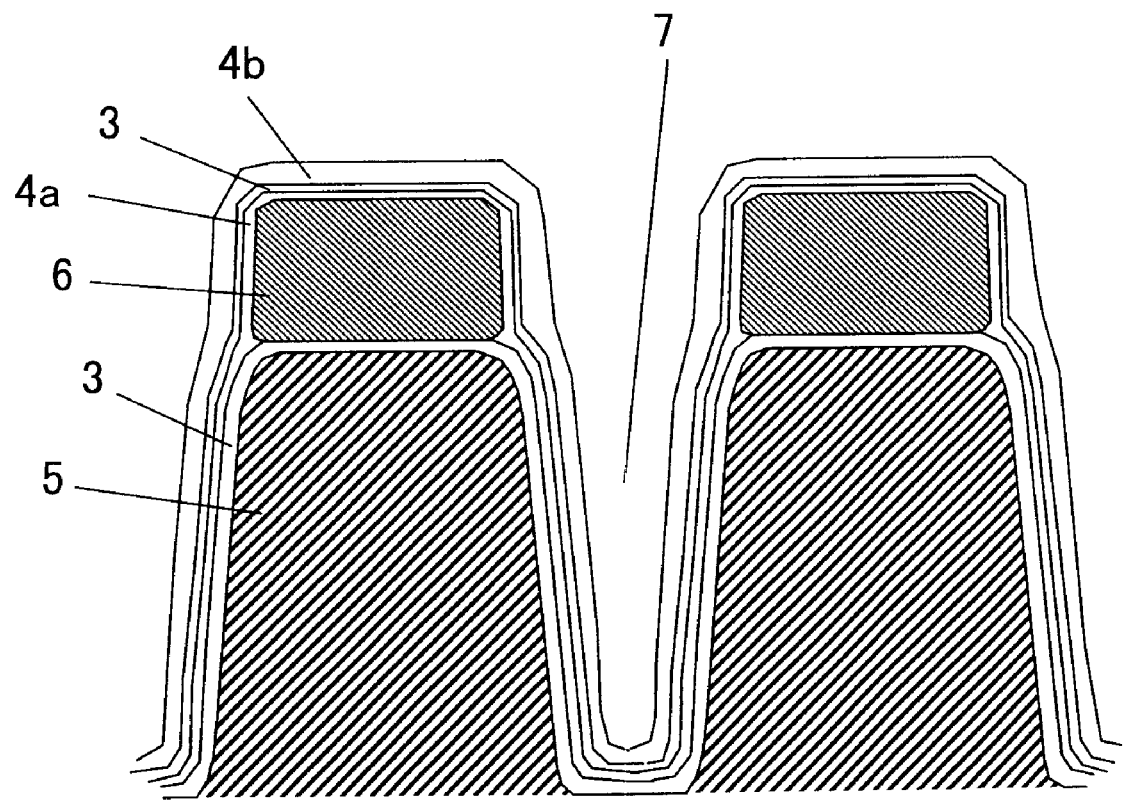
FIG. 14 shows a process of the method for manufacturing a semiconductor device according to the second embodiment.

Thereafter, liner nitride film 4b thick enough to allow hot phosphoric acid to form a recess is formed, as shown in FIG. 14. The thickness of liner film 4b can be, for example, 8 nm, as in the case of the first exemplary embodiment.

Figure 15:
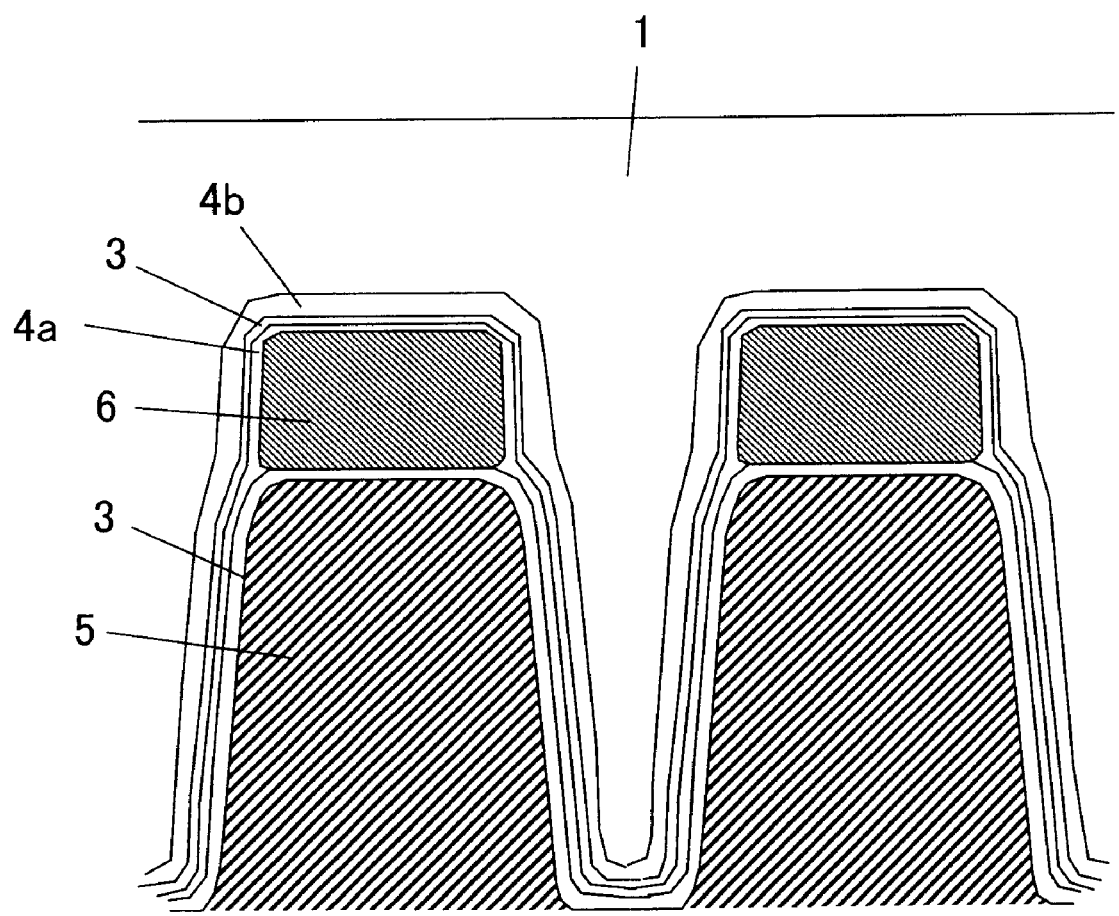
FIG. 15 shows a process of the method for manufacturing a semiconductor device according to the second embodiment.

Thereafter, spin coating or spray coating is used to form a polysilazane film, as shown in FIG. 15. The polysilazane film corresponds to an SOD film. The resultant structure is baked on a hot plate heated to 150° C. for approximately 3 minutes and then heat-treated in a water vapor atmosphere at a temperature ranging from 400° C. to 1100° C. SOD oxide film 1 is thus formed, as in the case of the first exemplary embodiment. SOD oxide film 1 corresponds to a silicon oxide film.

Figure 16:
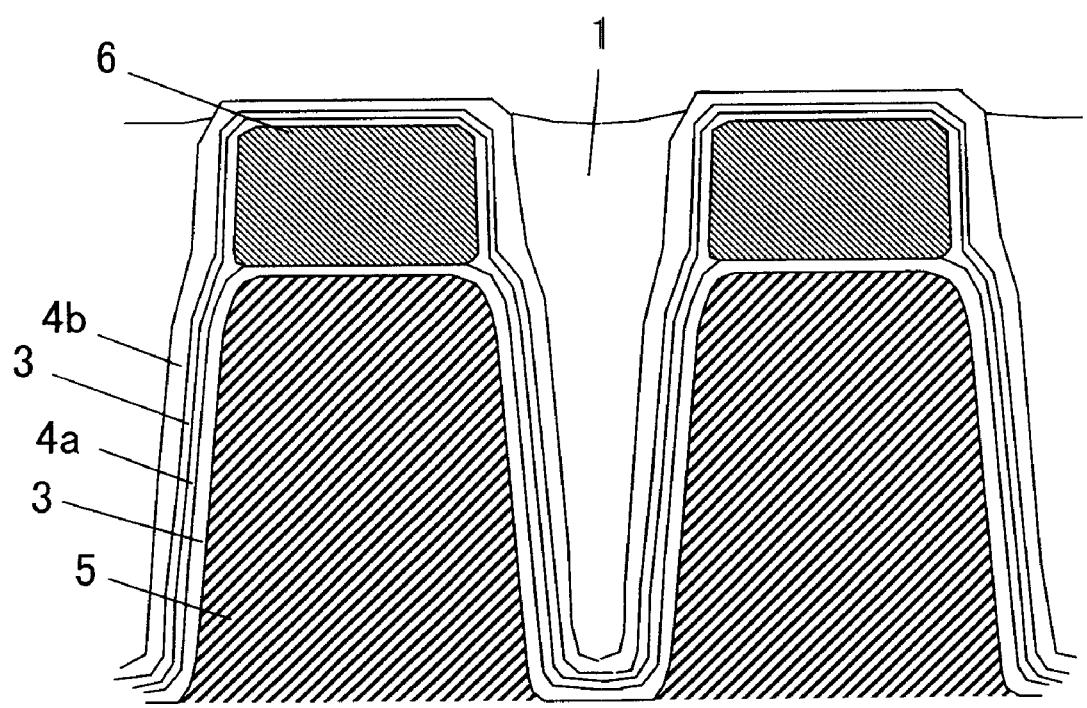
FIG. 16 shows a process of the method for manufacturing a semiconductor device according to the second embodiment.
Figure 17:
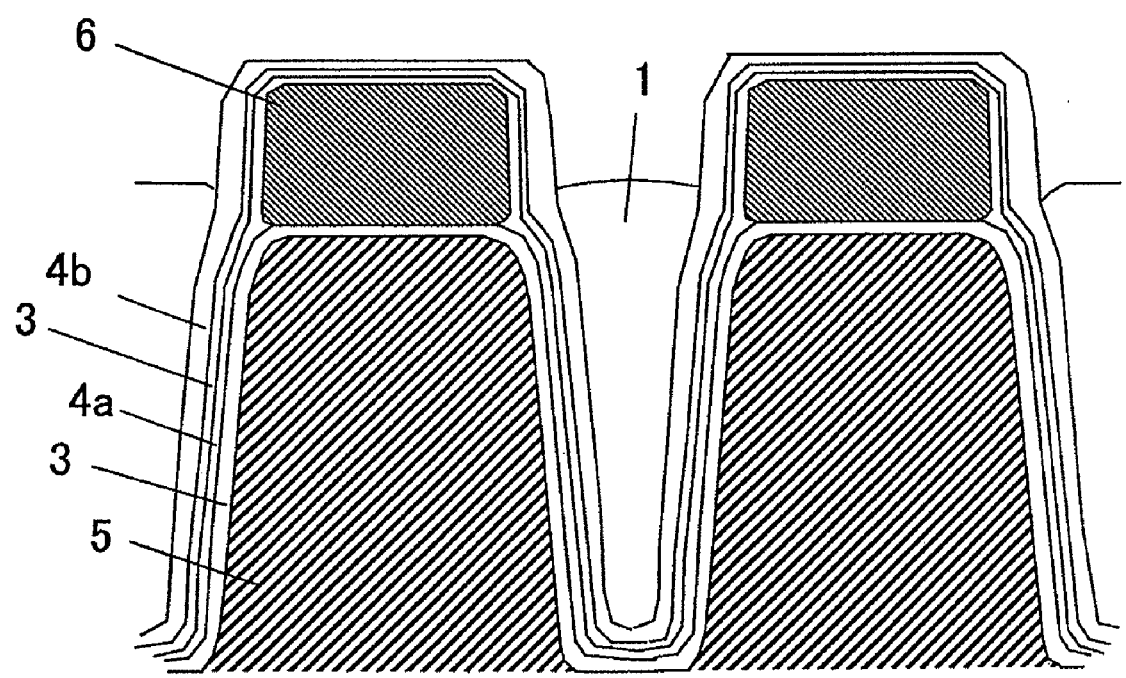
FIG. 17 shows a process of the method for manufacturing a semiconductor device according to the second embodiment.

Thereafter, liner nitride film 4b is used as a stopper, and SOD oxide film 1 is polished in a CMP process so that SOD oxide film 1 is left only in STI trench 7, as shown in FIG. 16. Subsequently, SOD oxide film 1 is etched back, as shown in FIG. 17. The etching back can be carried out in the same manner as in the first exemplary embodiment.

Figure 18:
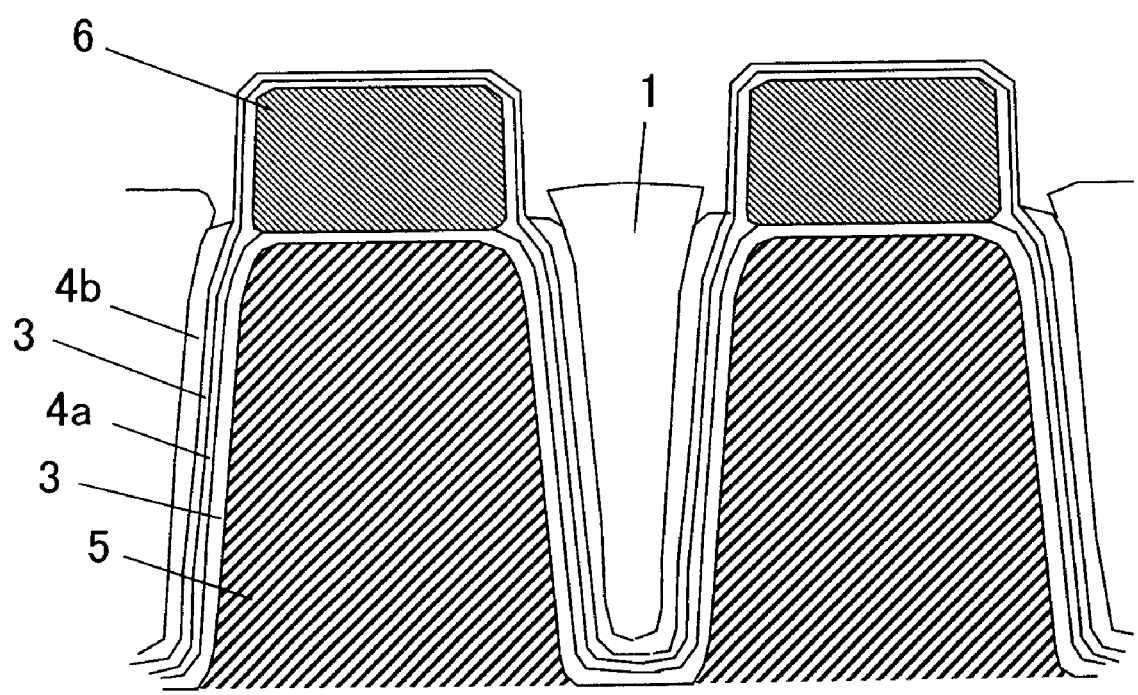
FIG. 18 shows a process of the method for manufacturing a semiconductor device according to the second embodiment.
Figure 19:
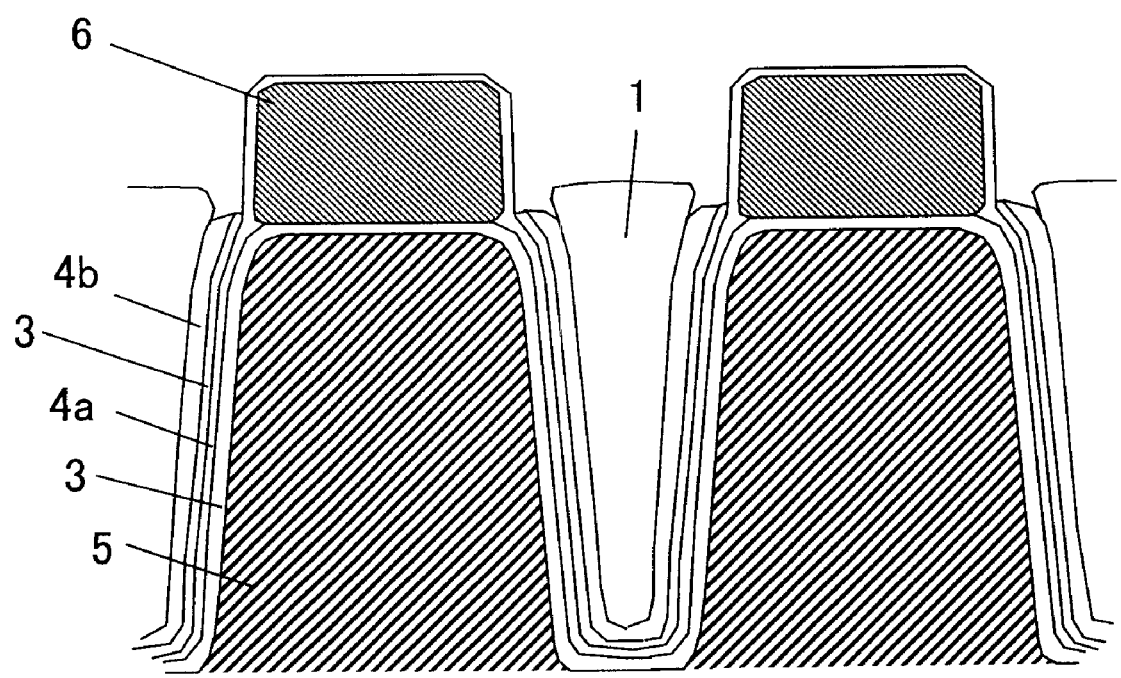
FIG. 19 shows a process of the method for manufacturing a semiconductor device according to the second embodiment.

Thereafter, thick liner nitride film 4b and silicon oxide film 3 formed by CVD are removed by wet etching, as shown in FIGS. 18 and 19.

Figure 20:
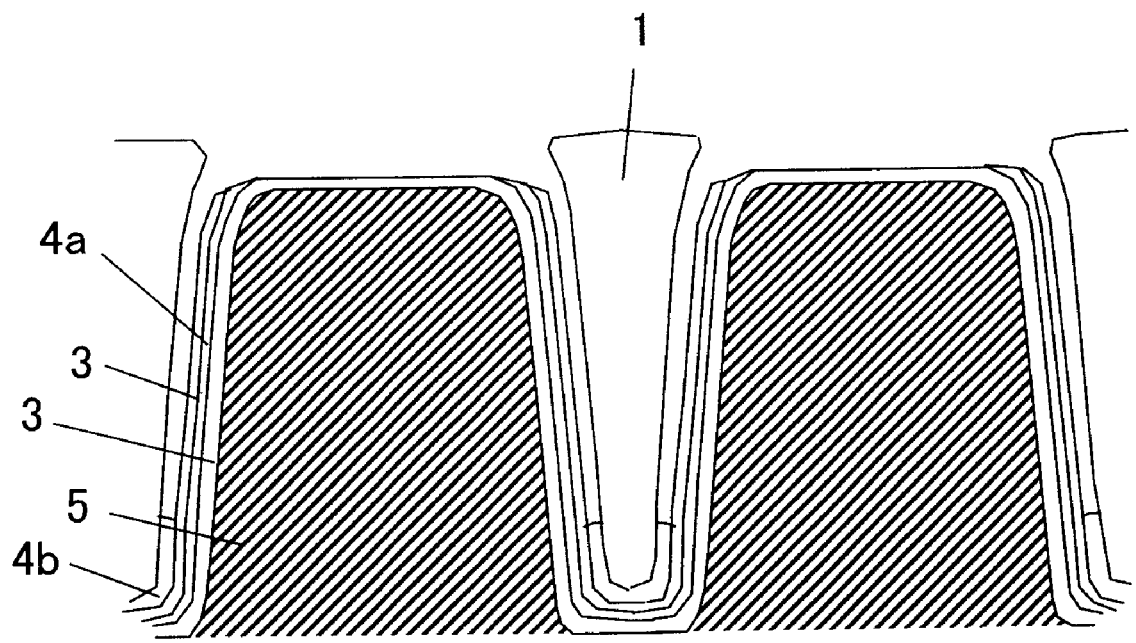
FIG. 20 shows a process of the method for manufacturing a semiconductor device according to the second embodiment.

Thereafter, wet etching using hot phosphoric acid is carried out to remove silicon nitride film 6, which is the hard mask, and thick liner nitride film 4b, as shown in FIG. 20. The etching can be carried out in the same manner as in the first exemplary embodiment. The resultant structure is subsequently heat-treated in a water vapor atmosphere at a temperature ranging from 800 to 1000° C. The heat treatment period, for example, ranges from 30 to 60 minutes.

Figure 21:
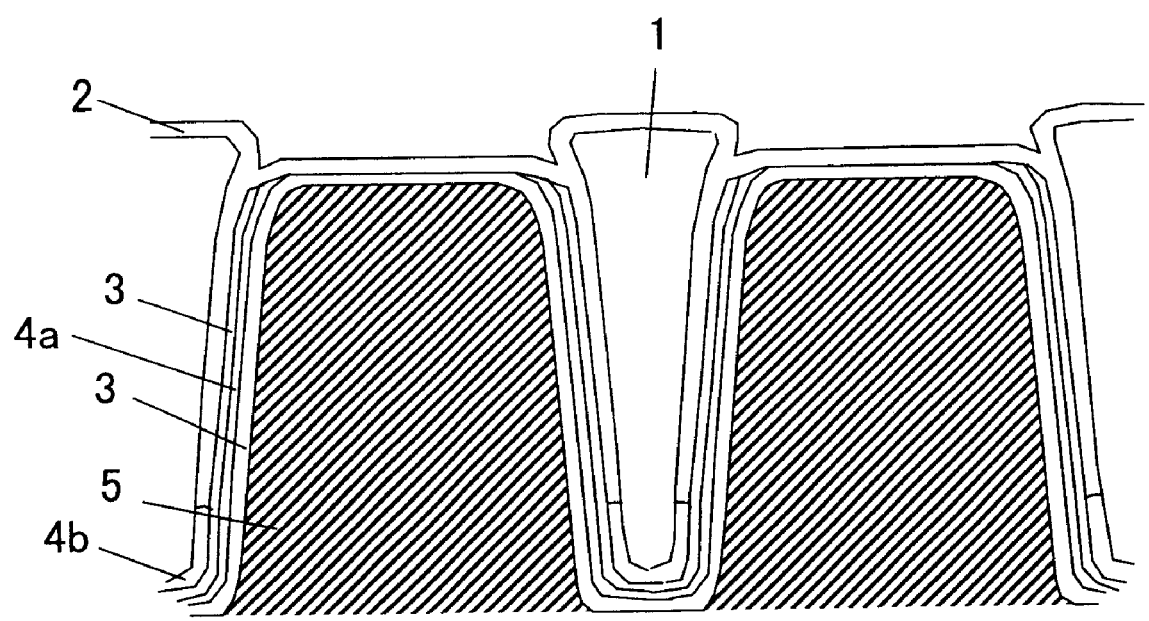
FIG. 21 shows a process of the method for manufacturing a semiconductor device according to the second embodiment.
Figure 22:
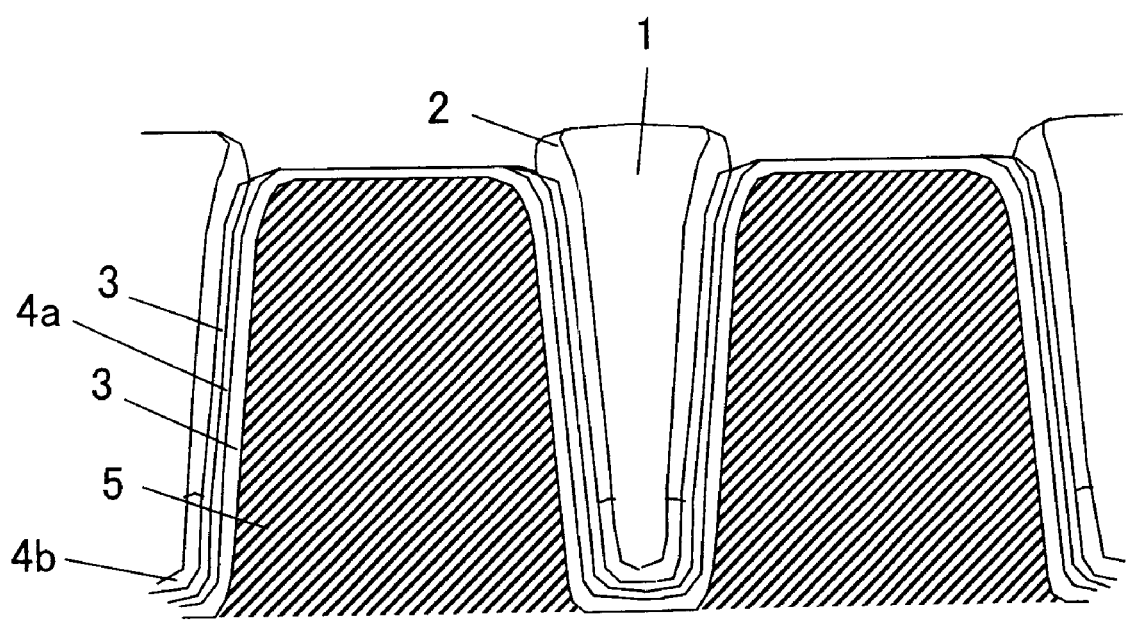
FIG. 22 shows a process of the method for manufacturing a semiconductor device according to the second embodiment.

Finally, ALD-SiN is deposited to fill the recess of the liner nitride film and then etched back, as shown in FIGS. 21 and 22.

In the present exemplary embodiment, the structure including the liner film is obtained by stacking the silicon nitride film (thick), the silicon oxide film, and the silicon nitride film (thin). The silicon nitride film (thick) is formed to have a thickness that allows the etchant to get into the film and form a recess, whereas the silicon nitride film (thin) is formed to have a thickness that does not allow the etchant to get into the film. It is therefore possible to prevent the silicon substrate from being oxidized when the polysilazane film is heat-treated in an oxidizing atmosphere. As a result, the polysilazane film can be more effectively densified, and a high-quality silicon oxide film with more excellent electric characteristics can be provided.

Third Exemplary Embodiment

Figure 23:
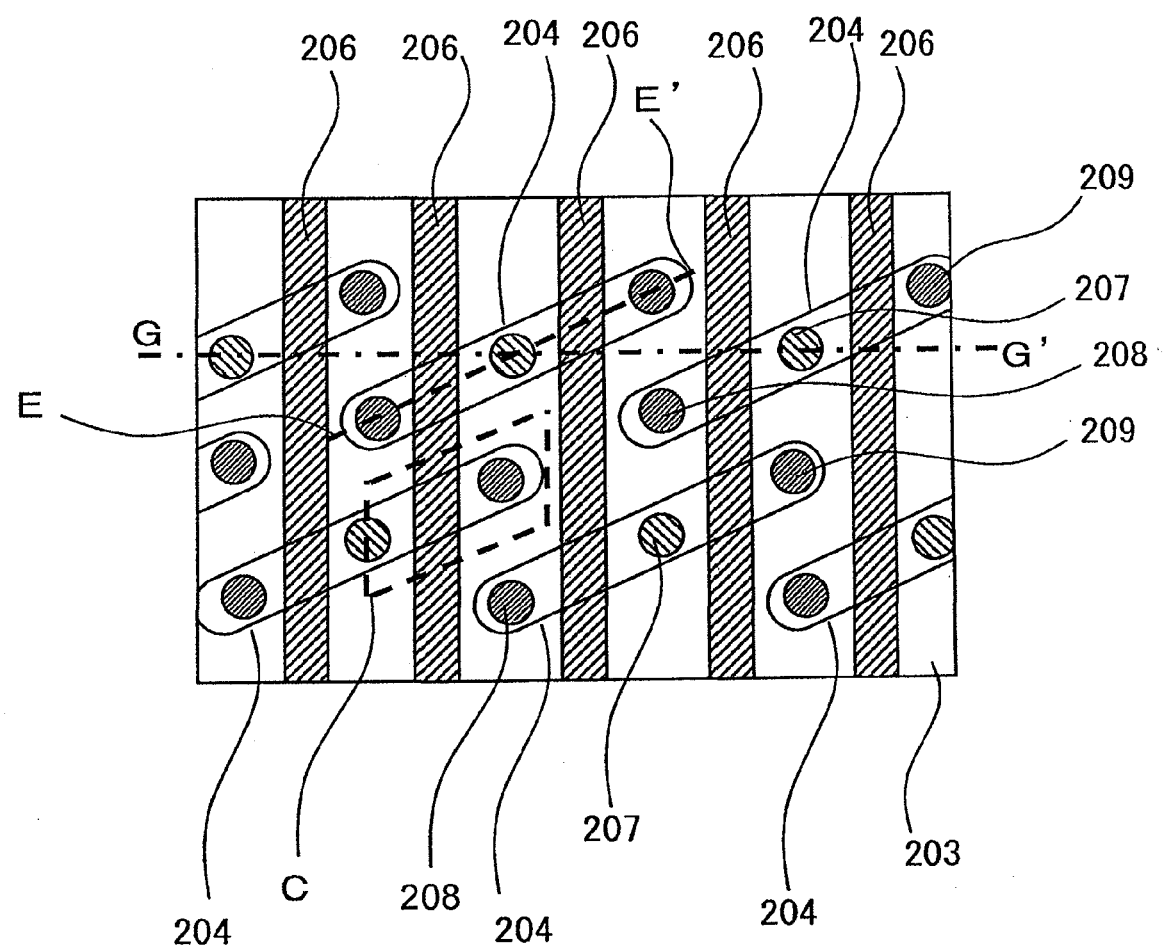
FIG. 23 shows a semiconductor device according to a third embodiment.

FIG. 23 is a plan view showing DRAM memory cells with an isolating region. In FIG. 23, a plurality of active regions 204 are regularly arranged on a semiconductor substrate. Active regions 204 are partitioned by isolating region 203 and the isolating region 203 is formed continuously so as to surround each of active regions 204. Isolating region 203 is formed, for example, in accordance with the methods described in the first and second exemplary embodiments. In this case, a trench is formed between active regions 204 and an edge of each trench is connected with each other.

A plurality of word lines 206 are formed in such a way that they intersect active regions 204. Phosphorus or any other suitable impurity is ion-implanted into the portions of active regions 204 that are not covered with the word lines so as to form diffusion layer regions. Each of the diffusion layer regions functions as a source-drain region of a transistor.

The portion surrounded by broken line C in FIG. 23 forms a single transistor. The other active regions 204 similarly form transistors. While in the present exemplary embodiment, word lines 206 are laid out to obliquely intersect active regions 204 as shown in FIG. 23, word lines 206 may be laid out to perpendicularly intersect active regions 204, and no manufacturing-related problem occurs in this case as well.

First contact plug 207 is provided at a central portion of each of active regions 204 and is in contact with the diffusion layer region in the surface of active region 204. Second contact plugs 208 and 209 are provided at both ends of each of active regions 204 and are in contact with the diffusion layer regions in the surface of active region 204. First and second contact plugs 207, 208, and 209 can be formed simultaneously when they are actually manufactured, although they have different reference numbers for the sake of description.

In the layout described above, two adjacent transistors are disposed to share single first contact plug 207 in order to arrange the memory cells at a high density.

In a later process, wiring layers (not shown) in contact with first contact plugs 207 are formed in the direction indicated by line G-G' perpendicular to word lines 206. The wiring layers function as bit lines of the DRAM. Capacitor elements (not shown) are connected to second contact plugs 208 and 209.

Figure 24:
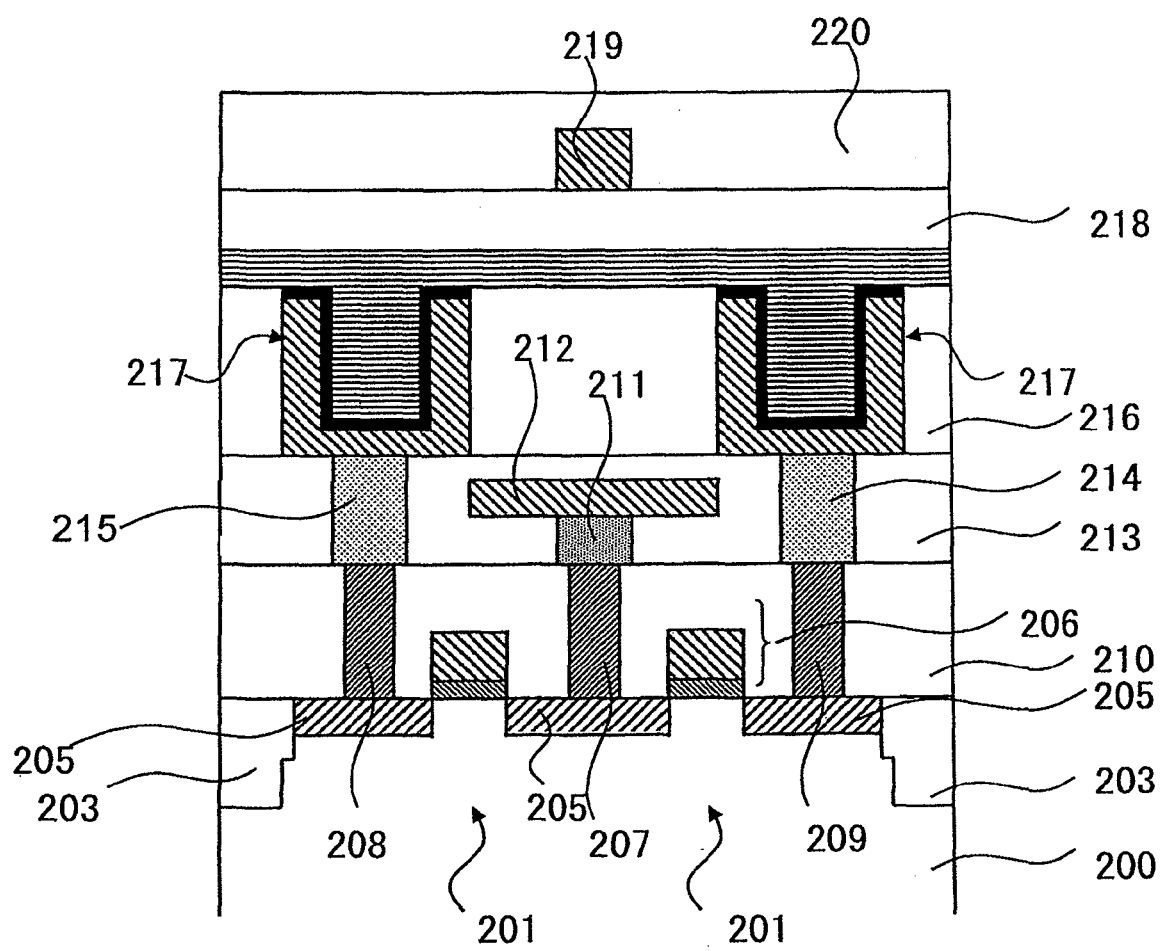
FIG. 24 shows the semiconductor device according to the third embodiment.

FIG. 24 is a cross-sectional view showing a completed DRAM memory cell taken along line E-E' in FIG. 23. In FIG. 24, reference numeral 200 denotes a semiconductor substrate, and reference numeral 201 denotes a field-effect transistor. The detailed structure of the transistor is omitted here because it has been described above. Reference numeral 206 denotes a word line.

Diffusion layer regions 205 are formed in the surface of active region 204 and are in contact with first and second contact plugs 207, 208, and 209. First and second contact plugs 207, 208, and 209 can be made of polycrystalline silicon to which phosphorous is introduced. Reference numeral 210 denotes an interlayer insulating film provided on the transistors. First contact plug 207 is connected to wiring layer 212, which functions as a bit line, via first contact plug 211. Wiring layer 212 can be made of tungsten.

Second contact plugs 208 and 209 are connected to capacitor elements 217 via second contact plugs 215 and 214. Reference numerals 213, 216, and 218 denote interlayer insulating films for insulating wiring from one another. Each of capacitor elements 217 is formed by sandwiching an insulating film made of hafnium oxide (HfO) or any other suitable material between two electrodes in accordance with a known method. Reference numeral 219 denotes a wiring layer located in an upper layer and made of aluminum or any other suitable material. Reference numeral 220 denotes a surface protective film.

When any of transistors 201 is turned on, it can be judged whether or not electric charge is accumulated in the corresponding capacitor element 217 by using the bit line (wiring layer 212), and the whole structure can operate as a DRAM memory cell capable of storing information.

The semiconductor device of the present exemplary embodiment can be formed by forming the isolating region as shown in the first or second embodiment and then forming memory cells in and on the semiconductor substrate surrounded by the isolating region. Each of the memory cells can be formed by the following processes:

(a) forming a field-effect transistor in and on the semiconductor substrate, (b) forming a capacitor in such a way that the capacitor is electrically connected to either of the source or drain region of the field-effect transistor, and (c) forming a bit line in such a way that the bit line is electrically connected to the other of the source and drain region of the field-effect transistor The field-effect transistor and the capacitor can be formed in accordance with known methods.

The "SOD oxide film" used herein represents a film obtained by using spin coating, spray coating, or any other suitable rotation application technique to apply a dielectric material-containing solution so as to form an SOD film and then heat-treating the SOD film so that the SOD film is oxidized. The "SOD" is referred as spin on dielectric.

As described above, in the above exemplary embodiments, the liner film is removed to expose the sides of part of the SOD oxide film and the surface area thereof increases accordingly, which facilitates the densification of the SOD oxide film in the heat treatment. It is therefore possible to eliminate a gate short circuit defect that occurs when polysilicon, which is a gate electrode material, gets into the gap produced in the isolating region and the polysilicon is not removed but remains when the polysilicon is processed. Further, facilitating the densification of the SOD oxide film allows a high-quality film that is not affected, for example, by stationary electric charge but has excellent electric characteristics to be provided.

As a result, there is provided a semiconductor device with an isolating region including an SOD oxide film having excellent etching resistance that prevents a gap from being produced in the etching process, and excellent electric characteristics that are not affected, for example, by stationary electric charge.

It is apparent that the present invention is not limited to the above embodiments, but may be modified and changed without departing from the scope and spirit of the invention.

What is claimed is:

1. A method for manufacturing a semiconductor device, the method comprising:
    forming a mask film on a semiconductor substrate;
    patterning the mask film to form a mask pattern;
    etching the semiconductor substrate by using the mask pattern as a mask, to form a trench;
    thermally oxidizing an inner wall of the trench, to form an oxide film;
    forming a liner film so as to cover the oxide film on the inner wall of the trench;
    depositing an SOD film over the trench and then carrying out a heat treatment to convert the SOD film into an SOD oxide film;
    processing the SOD oxide film to a predetermined height in the trench by
    (a) using the mask pattern as a stopper to carry out chemical mechanical polishing on the SOD oxide film and then etching back the SOD oxide film, or
    (b) etching back the SOD oxide film;
    removing the mask pattern and part of the liner film in contact with the SOD oxide film, to expose part of the SOD oxide film and form a gap in the trench;
    carrying out a heat treatment on the SOD oxide film; and
    filling an insulating film in the gap in the trench, to form an isolating region,
    wherein in forming the liner film,
    a first silicon nitride film, a silicon oxide film, and a second silicon nitride film are sequentially formed as the liner film on the semiconductor substrate,
    in forming the gap in the trench,
    part of the second silicon nitride film, as the liner film in contact with the SOD oxide film, is removed, and
    in forming the isolating region,
    an atomic layer deposition method is used to fill the insulating film.

2. The method for manufacturing a semiconductor device according to claim 1, wherein the liner film is a silicon nitride film.

3. The method for manufacturing a semiconductor device according to claim 2, wherein thickness of the liner film ranges from 3 to 15 nm.

4. The method for manufacturing a semiconductor device according to claim 2,
    wherein in carrying out the heat treatment, the heat treatment on the SOD oxide film is carried out in a nitrogen atmosphere at a temperature ranging from 700 to 1100.degree.C. for a period ranging from 30 to 60 minutes.

5. The method for manufacturing a semiconductor device according to claim 1,
    wherein thickness of the first silicon nitride film ranges from 1 to 4 nm, and thickness of the second silicon nitride film ranges from 3 to 15 nm.

6. The method for manufacturing a semiconductor device according to claim 1,
    wherein in carrying out the heat treatment, the heat treatment on the SOD oxide film is carried out in a water vapor atmosphere at a temperature ranging from 800 to 1000.degree.C. for a period ranging from 30 to 60 minutes.

7. The method for manufacturing a semiconductor device according to claim 1, after forming the isolating region, further comprising:
forming a field-effect transistor in and on the semiconductor substrate surrounded by the isolating region;
forming a capacitor electrically connected to one of the source and drain regions of the field-effect transistor; and
forming a bit line electrically connected to the other of the source and drain regions of the field-effect transistor.

8. A method for manufacturing a semiconductor device, the method comprising:
forming a trench in a semiconductor substrate;
forming a first insulating film on an inner wall of the trench;
forming a liner film so as to cover the first insulating film on the inner wall of the trench;
filling a highly fillable oxide film in the trench;
removing a portion of the liner film in contact with the highly fillable oxide film to expose a sidewall of the highly fillable oxide film and form a gap in the trench;
carrying out a heat treatment on the highly fillable oxide film at a temperature ranging from 700 to 1100° C. for a period ranging from 30 to 60 minutes after forming the gap, the heat treatment being carried out on the highly fillable oxide film to which an impurity doping has not been performed after forming the gap; and
filling a second insulating film in the gap in the trench after carrying out the heat treatment, to form an isolating region.

9. The method for manufacturing a semiconductor device according to claim 8, wherein thickness of the liner film ranges from 3 to 15 nm.

10. The method for manufacturing a semiconductor device according to claim 8,
wherein in forming the liner film,
a first silicon nitride film, a silicon oxide film, and a second silicon nitride film are sequentially formed as the liner film on the semiconductor substrate, and
in forming the gap in the trench,
part of the second silicon nitride film, as the liner film in contact with the highly fillable oxide film, is removed.

11. The method for manufacturing a semiconductor device according to claim 10,
wherein thickness of the first silicon nitride film ranges from 1 to 4 nm, and thickness of the second silicon nitride film ranges from 3 to 15 nm.

12. The method for manufacturing a semiconductor device according to claim 10,
wherein in carrying out the heat treatment, the heat treatment on the highly fillable oxide film is carried out in a water vapor atmosphere at a temperature ranging from 800 to 1000° C. for a period ranging from 30 to 60 minutes.

13. The method for manufacturing a semiconductor device according to claim 8, after forming the isolating region, further comprising:
forming a field-effect transistor in and on the semiconductor substrate surrounded by the isolating region;
forming a capacitor electrically connected to one of the source and drain regions of the field-effect transistor; and
forming a bit line electrically connected to the other of the source and drain regions of the field-effect transistor.

14. A method for manufacturing a semiconductor device, the method comprising:
forming a trench in a semiconductor substrate;
forming an oxide film on an inner wall of the trench;
forming a liner film so as to cover the oxide film on the inner wall of the trench, the liner film being a silicon nitride film;
filling a highly fillable oxide film in the trench;
removing a portion of the liner film in contact with the highly fillable oxide film to expose a sidewall of the highly fillable oxide film and form a gap in the trench;
facilitating a densification of the highly fillable oxide film after forming the gap, the facilitating the densification being carried out on the highly fillable oxide film to which an impurity doping has not been performed after forming the gap; and
filling an insulating film in the gap in the trench after facilitating the densification of the highly fillable oxide film, to form an isolating region.

15. The method as claimed in claim 14, wherein facilitating the densification of the highly finable oxide film is performed by carrying out a heat treatment on the highly fillable oxide film at a temperature ranging from 700 to 1000° C. for a period ranging from 30 to 60 minutes.

16. A method of forming a semiconductor device, comprising:
forming a trench in a semiconductor substrate;
forming a first insulating film on an inner wall of the trench;
forming a liner film to cover the first insulating film on the inner wall of the trench;
filling a highly finable oxide film in the trench;
removing a portion of the liner film in contact with the highly fillable oxide film to form a gap defined by a side surface of the highly fillable oxide film, a top surface of the liner film and a side surface of the first insulating film in the trench;
carrying out a heat treatment on the highly fillable oxide film at a temperature ranging from 700 to 1100° C. for a period ranging from 30 to 60 minutes to facilitate a densification of the highly fillable oxide film; and
filling a second insulating film in the gap in the trench to form an isolating region,
wherein in forming the liner film,
a first silicon nitride film, a silicon oxide film, and a second silicon nitride film are sequentially formed as the liner film on the semiconductor substrate, and
in forming the gap,
part of the second silicon nitride film, as the liner film in contact with the highly fillable oxide film, is removed.

17. The method as claimed in claim 16,
wherein in forming the isolating region, an atomic layer deposition method is used to fill the insulating film.

18. The method as claimed in claim 16,
wherein the highly fillable oxide film is an SOD (spin on dielectric) oxide film.

19. The method for manufacturing a semiconductor device according to claim 16, after forming the isolating region, further comprising:
forming a field-effect transistor in and on the semiconductor substrate surrounded by the isolating region;
forming a capacitor electrically connected to one of the source and drain regions of the field-effect transistor; and
forming a bit line electrically connected to the other of the source and drain regions of the field-effect transistor.

* * * * *